United States Patent [19]

Hall

[11] Patent Number: 4,920,399

[45] Date of Patent: Apr. 24, 1990

[54] CONDUCTANCE-MODULATED INTEGRATED TRANSISTOR STRUCTURE

[75] Inventor: John H. Hall, San Jose, Calif.

[73] Assignee: Linear Integrated Systems, Inc., Fremont, Calif.

[21] Appl. No.: 418,962

[22] Filed: Oct. 10, 1989

Related U.S. Application Data

[63] Continuation of Ser. No. 243,428, Sep. 12, 1988, abandoned.

[51] Int. Cl.[5] .................................... H01L 27/02
[52] U.S. Cl. ................................ 357/42; 357/15
[58] Field of Search .................. 357/42, 15, 43, 46, 357/23.7

[56] References Cited

U.S. PATENT DOCUMENTS

| | | | |
|---|---|---|---|
| 4,256,515 | 3/1981 | Miles et al. | 357/43 |
| 4,336,550 | 6/1982 | Medwin | 357/15 |
| 4,485,550 | 12/1984 | Koeneke et al. | 357/42 |

FOREIGN PATENT DOCUMENTS 59-181669 10/1984 Japan ................................. 357/15

Primary Examiner—Andrew J. James
Assistant Examiner—Mark Prenty
Attorney, Agent, or Firm—Flehr, Hohbach, Test, Albritton & Herbert

[57] ABSTRACT

Disclosed is an integrated transistor structure having increased conductance and operating speed including a complementary insulated gate field-effect transistor pair, each including a source and drain region with a gate contact positioned therebetween, an ohmic contact to the source regions, and a Schottky contact to each of the drain regions. The dopant concentration of the drain regions is sufficiently low to prevent the Schottky contact from forming an ohmic contact with the drain regions. The gates of the two transistors are interconnected and function as the input terminal, and the two Schottky contacts are interconnected as the output of the device. The operation of the device is such that the lightly-doped drain regions act as bases of bipolar transistors, with the emitters formed by the Schottky diodes. Minority and majority carriers injected by the Schottky diodes modulate the channel regions, thereby lowering their resistivity and increasing the transconductance of the device without increasing the physical size or the capacitance of the device and thereby improving the speed of the device.

6 Claims, 1 Drawing Sheet

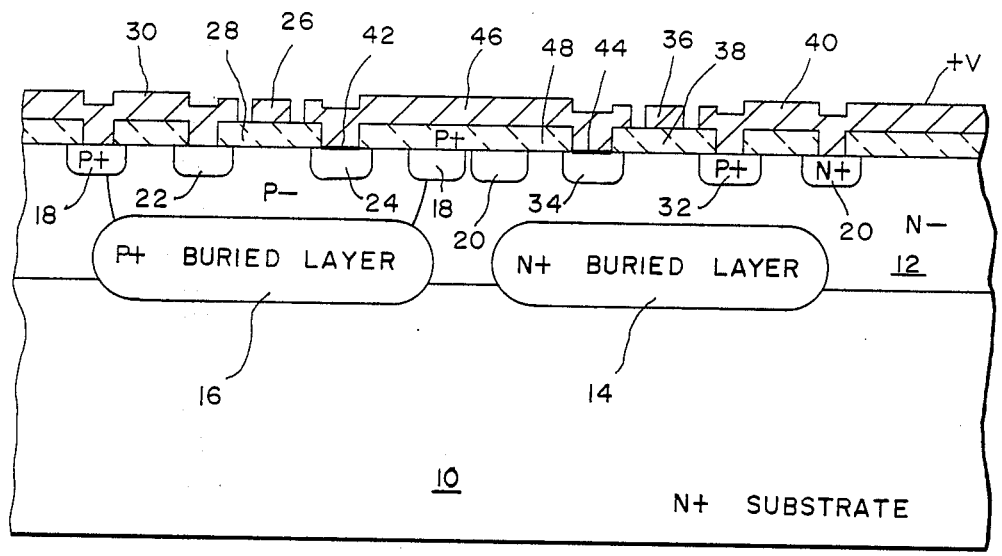
FIG.—1
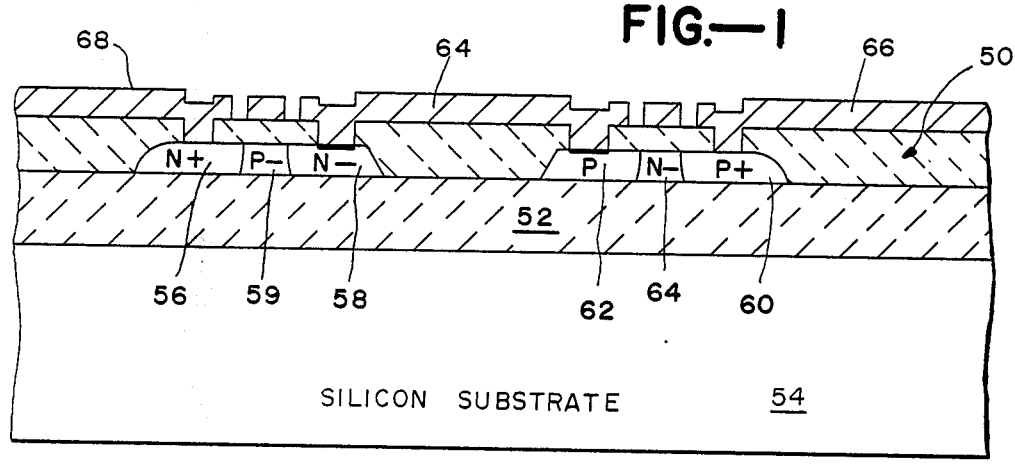
FIG.—3
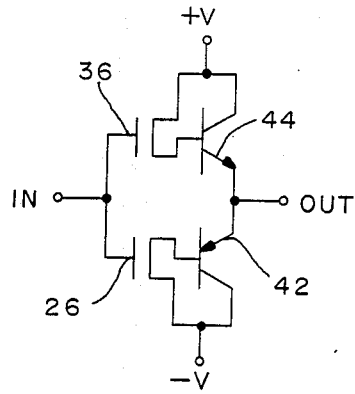
FIG.—2

CONDUCTANCE-MODULATED INTEGRATED TRANSISTOR STRUCTURE

This is a continuation of application Ser. No. 243,428, filed Sep. 12, 1088, now abandoned.

BACKGROUND OF THE INVENTION

This invention relates generally to semiconductor devices, and more particularly the invention relates to an integrated transistor logic device utilizing conductance modulation to increase transconductance and switching speed.

The CMOS transistor pair is widely used in integrated circuit logic applications. However, a limitation of such devices is speed of operation. The present invention is directed to modifying a CMOS transistor structure to include Schottky injection of minority carriers to increase transconductance and operating speed.

The use of Schottky injection in double-diffused MOS transistors (DMOS) is disclosed by Ng et al. in "P-channel Schottky Injection Field Effect Transistors," IEDM 1987, pp.770-773. As described therein, the high on resistance associated with p-channel DMOS transistors generally limits their current-handling capability. By using a p-n junction to inject a large amount of minority carrier into the drift region, very low on resistance can be achieved at the expense of slower switching speed.

However, use of a Schottky barrier p-n junction injector has provided a greater flexibility in optimizing switching speed in the Schottky Injection Field Effect Transistor (SINFET). A Schottky barrier contact is used on the place of the usual p+drain contact. At low forward bias, the p-n junction at the anode is off and the majority of the anode current flows through the Schottky barrier contact. At higher forward bias, the p-n junction would be slightly forward-biased and current will flow through the Schottky-clamped p-n junction anode. A large amount of minority carriers is then injected from the anode into the drift region, thus causing a strong conductivity modulation in the drift region.

SUMMARY OF THE INVENTION

An object of the invention is an integrated transistor structure having improved operating speed.

Another object of the invention is an insulated gate compound transistor structure using modulated conduction to increase operating speed.

A feature of the invention is the use cf a Schottky diode as the drain contact structure in a complementarypair inverter.

Briefly, a CMOS transistor pair is fabricated in the surface of a lightly-doped (on the order of $10^{12}$ atoms per cubic centimeter) semiconductor body such as an epitaxial layer formed on a supporting substrate. The drain region of each transistor is lightly doped (on the order of $10^{16}$ atoms per cubic centimeter) and a Schottky contact is made thereto as a drain contact. The resistivity of the drain region is sufficiently high to prevent formation of an ohmic contact to the drain region by the Schottky metal. The common gate terminals function as the device input, and the common Schottky contacts function as the device output.

In operation, the drains of the transistors are floating and form the bases of bipolar transistors with the Schottky diodes functioning as the emitters. The Schottky diodes inject minority and majority carriers when the MOS gates are turned on and cause a significant reduction in the on resistance of the channel regions thereby increasing its current-handling capacity, without increasing the gate-to-drain capacitance, and thereby increasing the inverter switching speed. Thus, the minority carriers injected by the Schottky diodes modulate the channel regions, thereby lowering their resistivity at the same time as the minority carriers are collected by the source. The net result of the structure is to increase the transconductance without increasing the physical size or the capacitance of the device, thereby improving the speed of the device, the Schottky structure allowing for a very rapid recovery from the conduction mode.

In another embodiment of the invention, the integrated transistor structure is fabricated in a silicon layer on an insulator such as sapphire (SOS), silicon oxide, or silicon nitride.

The invention and objects and features thereof will be more readily apparent from the following detailed description and appended claims when taken with drawing.

BRIEF DESCRIPTION OF THE DRAWING

FIG. 1 is a section view of a complementary MOS transistor pair fabricated in accordance with the present invention.

FIG. 2 is a schematic diagram of the integrated transistor structure of FIG. 1.

FIG. 3 is a section view illustrating another embodiment of an integrated transistor structure in accordance with the invention.

DETAILED DESCRIPTION OF ILLUSTRATIVE EMBODIMENTS

Referring now to the drawing, FIG. 1 is a section view illustrating an integrated transistor structure in accordance with one embodiment of the invention. In this embodiment, an n+substrate 10 has an n−epitaxial layer 12 formed thereon. The dopant concentration of the epitaxial layer is very light, on the order of $10^{12}$ atoms per cubic centimeter. An n+buried layer 14 and a p+buried layer 16 are provided at the interface of the epitaxial layer 12 and substrate 10. Conventionally, the buried layer is formed by highly doped surface regions of the substrate 10 prior to the epitaxial growth of layer 12. The portion of the n−epitaxial layer 12 above the p+buried layer 16 is converted to p−conductivity by ion implantation. P+regions 18 are formed at the surface of epitaxial layer 12 and define a device region above the p+buried layer 16, and n−buried layer, and n+regions 20 are formed in the surface of the epitaxial layer 12 of the n+buried layer region 14 and define a second device region.

An n-channel insulated-gate transistor is formed in the first device region with an n+source region 22 formed in the surface and a lighter-doped n−region 24 spaced from the n−region 22 and defining the drain region. A gate contact 26 is formed over an insulated layer 28 between the source 22 and drain 24. A first metallization 30 interconnects the source 22 to a −V contact.

Similarly, a p-channel insulated-gate transistor is fabricated in the second device region above the n+buried layer 14 with a p+region 32 forming the source and a lighter-doped p−region 34 forming the drain. A gate contact 36 is formed over an insulating layer 38 between the source 32 and drain 34. Metallization 40 connects the source 32 with a +V contact.

In accordance with the invention, Schottky contacts 42 and 44 are made to the $n^{31}$ drain 24 and to the $p^{31}$ drain 34 of the two transistors. The Schottky contact 42 is fabricated using platinum silicide or molybdenum in contact with the lightly-doped drain region 24. The Schottky contact 44 is fabricated using titanium or titanium molybdenum in contact with the lightly-doped drain region 34. The two Schottky contacts are interconnected by a conductive layer 46 such as aluminum or molybdenum formed over an insulated layer 48 on the surface of the epitaxial layer 12.

As described above, the drains of each transistor are lightly doped, on the order of $10^{16}$ atoms/cc whereby the Schottky metal does not form an ohmic contact to the drain region. FIG. 2 is an electrical schematic of the structure in which the input is applied to the common terminal of the gates 26 and 36 of the two field-effect transistors, and the output is taken at the common connection of the Schottky contacts 42, 44 of the two transistors. As described above, in operation of the device the lightly-doped drain regions function as bases of bipolar transistors with the emitters formed by the Schottky diodes. The minority and majority carriers injected by the Schottky diodes modulate each channel region thereby lowering its resistivity at the same time the minority carriers are collected by the source and the buried layer diffused into the substrate under the epitaxial region of the two transistor structures. The net result of this structure is to increase the transconductance by a factor of 5 without increasing the physical size or capacitance of the device, thereby improving the speed of the device. The Schottky contacts allow for a very rapid recovery from the conduction mode.

FIG. 3 is a section view of another embodiment of the integrated transistor structure in which the device is fabricated in a silicon layer 50 formed on an insulative layer of silicon oxide or silicon nitride 52 on the surface of a silicon substrate 54. The substrate can be sapphire, also. In this embodiment, the n-channel transistor includes an $n^+$source 56, an $n^-$drain region 58 with a $p^-$region therebetween. Similarly, the p-channel transistor includes a $p^+$source 60, a p drain 62 and an $n^-$region 64 therebetween. As in the structure of FIG. 1, Schottky contacts are made to the drains 58, 62 and are interconnected by metal 64. An aluminum or refractory metal interconnect 66 is provided to the $p^+$source 60, and an aluminum or refractory metal interconnect 68 is made to the $n^+$source 56.

There has been described an integrated transistor logic device in which Schottky contacts to the drain regions of complementary transistors provide conductance modulation, thereby increasing the transconductance and operating speed of the device.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

I claim:

1. An integrated CMOS transistor structure comprising a semiconductor body having a major surface with a first device region of a first conductivity type and a second device region of a second conductivity type therein, a first device formed in said first device region and including a source region and a drain region of said second conductivity type, said source and drain regions being spaced apart by a channel region and each of said source and drain regions forming a p-n junction with said first device region, a gate contact between said source and drain regions and insulatively spaced from said device region, an ohmic contact solely to said source region and a Schottky contact solely to said drain region, said Schottky contact forming a Schottky diode with said drain region which is forward biased and injecting minority carriers into said channel region when said gate contact is voltage biased on.

a second device formed in said second device region and including a source region and a drain region of first conductivity type, said source and drain regions being spaced apart by a channel region and each of said source and said drain regions forming a p-n junction with said second device region, a gate contact between said source and drain regions and insulatively spaced from said second device region, an ohmic contact solely to said source region and a Schottky contact solely to said drain region, said Schottky contact forming a Schottky diode with said drain region which is forward biased and injecting minority carriers into said channel region when said gate contact is voltage biased on.

input connector means interconnecting said gate contacts of said first and second devices, and output connector means interconnecting said Schottky contacts of said first and second devices.

2. The integrated transistor structure as defined by claim 1 wherein said semiconductor body comprises a semiconductor substrate and an epitaxial layer formed on a surface of said substrate.

3. The integrated transistor structure as defined by claim 2 wherein said first device further includes a first buried layer of said first conductivity type, and said second device further includes a second buried layer of said second conductivity type, wherein said and second buried layers collect some of the minority carriers injected from said Schottky diodes.

4. The integrated transistor structure as defined by claim 3 wherein the dopant concentration in said drain regions is sufficiently low to prevent said Schottky contacts from forming ohmic contacts with said drain regions.

5. The integrated transistor structure as defined by claim 1 and further including a supporting substrate having an insulating surface and wherein said semiconductor body is formed on said insulated surface and said first and second device regions comprise semiconductor layers on said insulated surface.

6. The integrated transistor structure as defined by claim 5 wherein the dopant concentration of said drain regions is sufficiently low to prevent said Schottky contacts from forming ohmic contacts with said drain regions.

* * * * *

UNITED STATES PATENT AND TRADEMARK OFFICE
CERTIFICATE OF CORRECTION

PATENT NO. : 4,920,399

DATED : April 24, 1990

INVENTOR(S) : JOHN H. HALL

It is certified that error appears in the above-identified patent and that said Letters Patent is hereby corrected as shown below:

Title page, delete reference to

Linear Integrated Systems, Inc.,

Fremont, Calif.

as Assignee.

Signed and Sealed this

Fourth Day of June, 1991

*Attest:*

HARRY F. MANBECK, JR.

*Attesting Officer*   *Commissioner of Patents and Trademarks*